United States Patent [19]

Holm-Kennedy et al.

[11] Patent Number: 5,036,286
[45] Date of Patent: Jul. 30, 1991

[54] MAGNETIC AND ELECTRIC FORCE SENSING METHOD AND APPARATUS

[75] Inventors: James W. Holm-Kennedy; Donald K. Umemoto, both of Honolulu, Hi.

[73] Assignee: The Research Corporation of the University of Hawaii, Honolulu, Hi.

[21] Appl. No.: 501,296

[22] Filed: Mar. 12, 1990

Related U.S. Application Data

[63] Continuation of Ser. No. 202,003, Jun. 3, 1988, abandoned.

[51] Int. Cl.$^5$ .................... G01R 27/26; G01R 33/038
[52] U.S. Cl. .................................. 324/661; 324/259; 324/262
[58] Field of Search .................... 324/207.11, 207.12, 324/207.13, 207.14, 661, 690, 684–686, 71.5, 72, 260, 252; 73/780, 862.63, 862.64, 862.69, 718–727; 340/870.37; 307/309, 320; 310/327, 311; 357/27, 51; 361/383; 338/3, 4, 42, 47, 114

[56] References Cited

U.S. PATENT DOCUMENTS

| | | |
|---|---|---|
| 3,278,919 | 10/1966 | Fleming . |
| 3,320,802 | 5/1967 | Birkholtz ................... 73/862.63 X |
| 3,353,098 | 11/1967 | Foster et al. ................... 324/661 X |
| 3,665,259 | 5/1972 | Brailsford ................... 310/329 X |
| 4,051,397 | 9/1977 | Taylor ................... 310/329 |
| 4,051,721 | 10/1977 | Williams ................... 324/661 X |
| 4,190,785 | 2/1980 | Kompanek ................... 310/311 X |
| 4,216,404 | 8/1980 | Kurtz et al. ................... 310/324 X |
| 4,255,976 | 3/1981 | Formato ................... 324/166 X |
| 4,347,478 | 8/1982 | Heerens et al. ................... 324/61 R X |
| 4,357,834 | 11/1982 | Kimura . |
| 4,371,945 | 2/1983 | Karr et al. ................... 364/561 |
| 4,443,754 | 4/1984 | King . |
| 4,506,556 | 3/1985 | Siby ................... 73/862.63 |
| 4,515,015 | 5/1985 | Kuhlman . |
| 4,562,430 | 12/1985 | Robinson ................... 324/661 X |
| 4,576,052 | 3/1986 | Sugiyama ................... 73/862.63 |
| 4,604,898 | 8/1986 | Gohin et al. ................... 324/61 R X |
| 4,627,292 | 12/1986 | Dekrone ................... 73/862.64 X |
| 4,636,714 | 1/1987 | Allen ................... 324/60 CD |
| 4,677,378 | 6/1987 | Tokura et al. ................... 324/166 X |
| 4,733,556 | 3/1988 | Meitzer . |

FOREIGN PATENT DOCUMENTS

2726228 12/1978 Fed. Rep. of Germany .

OTHER PUBLICATIONS

Borgnis—Theory of the Acoustic Interferometer for Plane Waves, Gordon McKay Laboratory of Applied Science, Harvard University, Cambridge, Mass., Acustica, vol. 7, 1957, pp. 151-174.

Primary Examiner—Kenneth A. Wieder
Assistant Examiner—W. S. Edmonds
Attorney, Agent, or Firm—James Creighton Wray

[57] ABSTRACT

A magnetic and electric force sensing method uses a force responsive transducer made of a micromachined, solid state magnetic sensor consisting of a central silicon platform surrounded and supported by a thin silicon membrane. The silicon substrate is placed over an aluminum pad recessed into a well on a supporting glass substrate. The magnetic sensor responds to a static method of measuring force whereby the Earth's magnetic field or magnetic field or other origin acts as an attractive or repulsive force towards the magnetic material placed onto the silicon platform. The magnetic force mechanically displaces the silicon platform and diaphragm membrane which is transduced to an electrical signal where a change in capacitance is measured. Geometry of the silicon platform, diaphragm membrane and glass well depth are used to affect the linearity, sensitivity and range of measurements of the magnetic sensor.

31 Claims, 16 Drawing Sheets

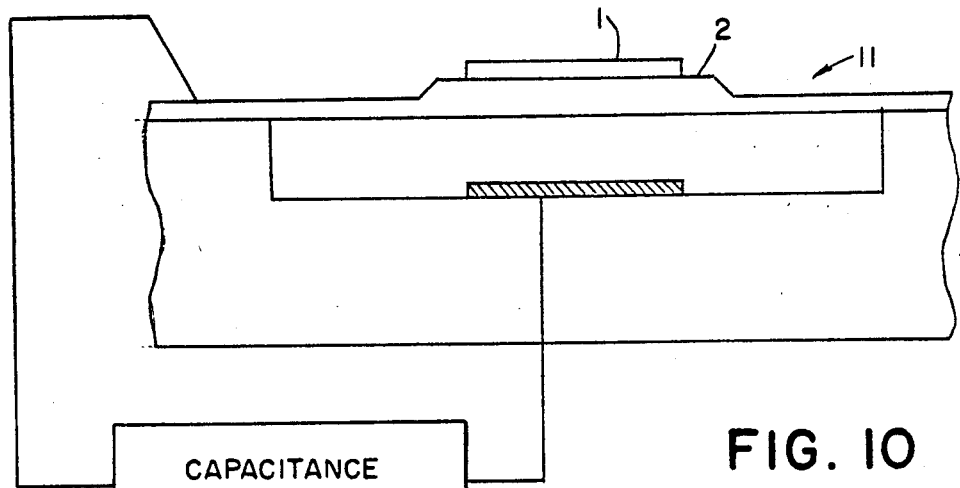
FIG. 10
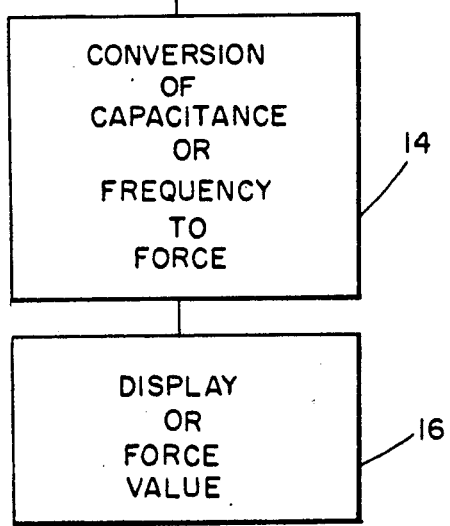
FIG. 11
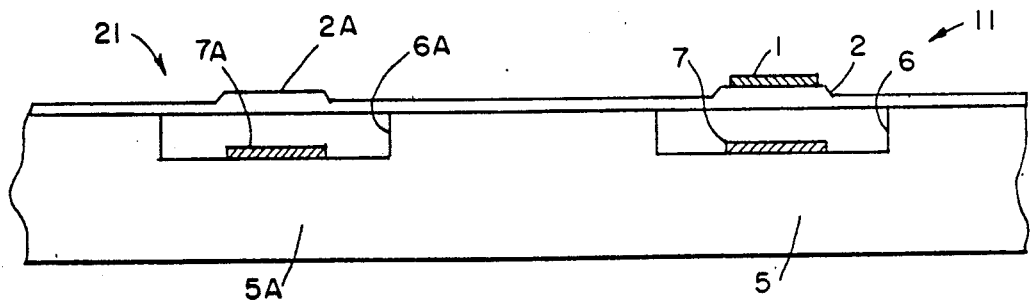

MAGNETIC AND ELECTRIC FORCE SENSING METHOD AND APPARATUS

This application is a continuation of application Ser. No. 202,003, filed June 3, 1988, now abandoned.

SUMMARY OF THE INVENTION

The present invention relates to magnetic sensors, the capabilities of which include the sensing of magnetic fields specifically but not limited to the Earth's magnetic field and the use of the capacitive property of the device to transduce the sensed magnetic force vector to an electrical capacitive signal.

Semiconductor magnetic sensors sensitive to the Earth's magnetic field are useful in maritime, aviation, military and scientific laboratories where very sensitive magnetic field measurements are required. The magnetic sensors produced by micromachine techniques allow various attractive features to be possible some of which include small size, low cost of production, ease of fabrication, ruggedness and high sensitivity.

The novel approach of transducing a magnetic force vector to an electrical capacitive sensing output is described. The micromachine magnetic sensor consists of a silicon platform, diaphragm membrane and die. The silicon substrate is placed over an aluminum pad recessed into a well, on a supporting glass substrate. The silicon platform and diaphragm membrane compose the dynamic portion of the capacitive plate while the aluminum pad in the glass substrate well serve as the static portion of the capacitive plate. The structure of the device is shown in FIG. 1. The magnetic sensor is responsive to magnetic fields through the magnetic material that is placed onto the silicon platform with a displacement of the silicon platform and diaphragm membrane changing the capacitive plate spacing. The new plate spacing is electrically sensed as an electrical capacitive change.

Thus it is the object of the present invention to sense magnetic field force vectors as a transduced electrical capacitive change.

Another object of the invention is to be able to sense magnetic force over a sufficiently wide range through a transduced electrical capacitive change.

Another object of the invention is to have high sensitivity over a sufficiently wide range of magnetic field strengths.

Another object of the invention is the method of producing the magnetic sensor through batch processing technology and micromachining methods. This will minimize cost and size of the transducer and provide reproducibility of transducer performance from device to device.

The novelty of the invention resides in, but is not limited by the application and method of transduction of magnetic force to capacitance. The transducer's silicon platform is displaced by the magnetic force vector acting on the magnetic material which is placed onto the silicon platform. The platform is supported by the silicon diaphragm membrane which bends whenever the transducers silicon platform is subjected to an attractive or repulsive magnetic force. The platform and diaphragm membrane together with any other micromechanical or micromachine structure is fabricated by current standard processing and technology given the device is fabricated from silicon, the material of choice.

The ability to sense magnetic force as a transduced electrical capacitance change utilizing a monolythic micromachine solid state transducer allows for the attractive features of economical production, ease of fabrication, reproducibility of performance parameters and the use of standard technologies.

The above signify the novel application and features characteristic to the invention and further manifests itself in the following description of each embodiment.

BRIEF DESCRIPTION OF THE DRAWINGS

Like numbers in bold print will be representative of like features shown in the figures.

FIG. 10 is a measurement schematic.

FIG. 11 shows dual sensors.

DETAILED DESCRIPTION OF THE PREFERRED EMBODIMENT

Figure 1:
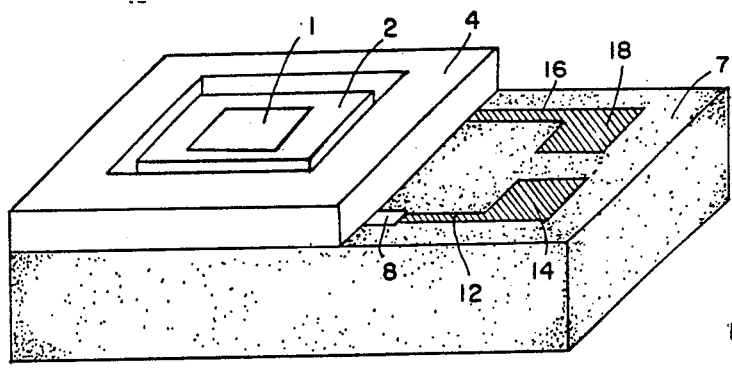
FIG. 1 is a schematic diagram of the device with magnetic material specifically but not limited to iron 1 on the silicon platform 2.

The present invention with its preferred embodiment is an application of a monolithic, micromachined solid state capacitance sensor used to sense a magnetic force vector. The magnetic sensor 11 with the magnetic material 1 on the silicon platform 2 is shown in FIG. 1.

Figure 6:
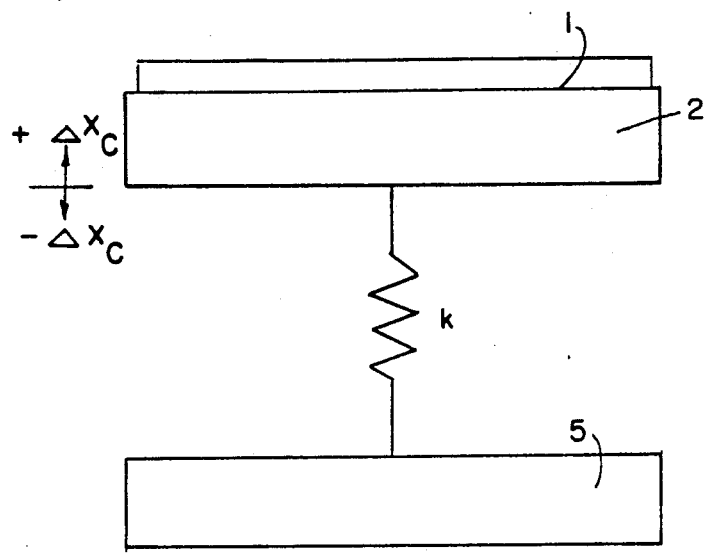
FIG. 6 is a mechanical network model of the magnetic sensor which allows the sensitivity of the microscale to be easily determined and altered through micromachine and standard processing technology of the preferred embodiment. The spring constant (k) of the magnetic sensor is a function of silicon diaphragm membrane 3 dimensions.

A magnetic material 1 on the silicon platform 2 has acting on it an magnetic field vector directed onto the magnetic material. The resultant magnetic force vector directed on the magnetic material 1 which is attached onto the silicon platform 2 decreases the capacitance plate separation from its original separation $X_{CO}$, by an amount $\Delta X_C$. Thus the resultant magnetic force vector directed on the magnetic material 1 is sensed as an electrical capacitance change due to a decrease in the capacitive plate separation by $\Delta X_C$. This is shown in FIG. 6.

As the magnetic sensor responds to a static method of measuring force similar to a spring, whereby the measurement of force is based on the fact that when a body under the action of several forces has zero acceleration, the vector sum of all the forces acting on that body must be zero. Thus with a known magnetic force vector directed on the magnetic material 1 which is attached onto the device platform 2, the magnetic force vector ($F_B$) displaces the platform 2 from $X_{CO}$ by an amount $\Delta X_C$, dependent upon an equal but oppositely directed spring force vector ($F_s$) shown in FIG. 4. Thus with only two oppositely directed vectors acting on the platform 2 with zero acceleration, it is concluded that $F_B$ and $F_s$ are vectors which are equal in magnitude, but oppositely directed.

The displacement of the platform 2 due to the magnetic force vector acting on the magnetic material 1 reflects a displacement of the dynamic capacitive plate. The degree to which a given magnetic force vector displaces the platform 2 is a function of the silicon diaphragm membrane 3. The bending of the membrane 3 is modeled as a spring with a spring constant of k. This mechanical model is shown in FIG. 6. The ease of design and altering the spring constant or sensitivity of the magnetic sensor by altering the diaphragm membrane 3 dimensions through standard micromachine fabrication technology is a preferred embodiment.

The device operation and the application for use as a magnetic sensor follows:

The silicon membrane 3 magnetic sensor shown in FIG. 1, is a two stage transducer. The first stage converts a magnetic force vector to a mechanical displacement of the device. The second stage converts the mechanical displacement to a change in capacitance.

The device utilizes a static method of measuring the Earth's magnetic field B, in a manner similar to that of a spring. The method is based on the principle that when a body under the action of several forces directed onto it has zero acceleration, the vector sum of all the forces acting on that body must be zero.

Figure 2:
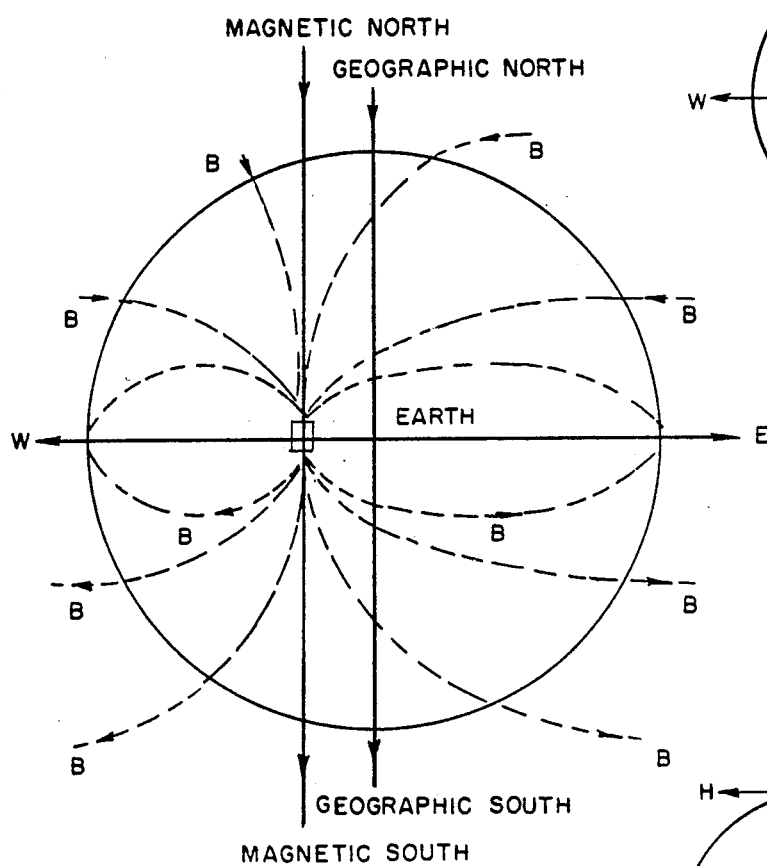
FIG. 2 is the Earth with a bar magnet slightly displaced to model the Earth's magnetic field. As shown the magnetic north or true north is slightly displaced from the geographic north. All magnetic field lines exit through the south and enter through the north.

The Earth's magnetic field vector B can be modeled as a bar magnet which is slightly displaced from the geographic center of the Earth as shown in FIG. 2. The resulting magnetic field vector B lines emerge from the Earth's surface over the entire southern hemisphere and enter the Earth's surface over the entire northern magnetic hemisphere. The origin of the Earth's magnetic field vector B which is represented by the bar magnet is known as the magnetic center of the Earth. The magnetic center of the Earth is displaced directly west of the geographic center. Thus the magnetic north 27 and the magnetic south 29 are displaced directly west of the geographic north 31 and the geographic south 33. Since the magnetic center is displaced directly west of the geographic center, the magnetic equator is at the same latitude as the geographic equator.

Figure 3A:
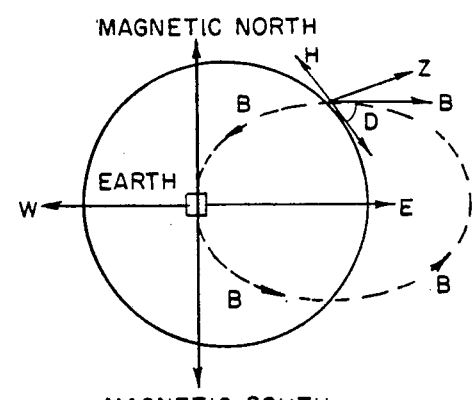
FIG. 3a illustrates the components that form the Earth's magnetic field. The total magnetic field vector is composed of two vectors; one tangential (H) and the other normal (Z) to the Earth's surface.

The Earth's magnetic field vector B is composed of two components which are at right angles to each another shown in FIG. 3a. One component of the Earth's magnetic field vector B is the horizontal component H which is horizontal to the Earth's surface. The other component of the Earth's magnetic field vector B is the normal component Z which is normal to the Earth's surface. The vertical plane which is bounded by the right angled H and Z vectors, is known as the magnetic meridian. The magnetic meridian includes the observer and the Earth's magnetic field B. The angle between the magnetic field vector B and the horizontal component H is the inclination angle or dip angle D shown in FIG. 3a. The dip angle D is $$D = \sqrt{(\vec{H}^2 + \vec{Z}^2)} \qquad 1$$

$$\tan D° = \frac{\vec{Z}}{\vec{H}}. \qquad 2$$

Figure 3B:
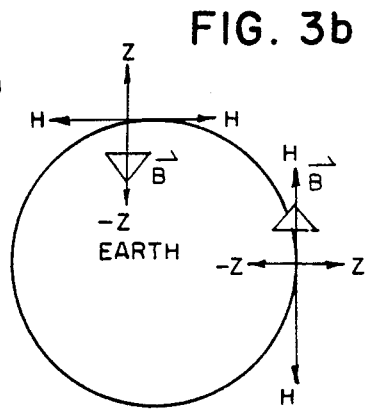
FIG. 3b shows the special case at the poles and equator. At the equator the tangential component is at the maximum value with the normal vector at a minimum or zero. While at the poles the tangetial vector is at its minimum or zero and the normal vector is at a maximum.

The angle of the dip angle D varies from 0° at the magnetic equator to 90° at the magnetic poles as shown in FIG. 3b. At the magnetic equator, the Earth's magnetic field vector B is horizontal to the Earth's surface. Thus the Earth's magnetic field vector B is composed entirely of the horizontal component H with zero contribution by the normal component Z. At the magnetic poles, the Earth's magnetic field vector B is normal to the Earth's surface. Thus the Earth's magnetic field vector B at the magnetic poles is composed entirely of the normal component Z with zero contribution by the horizontal component H. From the magnetic equator where the equator dip angle D is at a minimum (D=0°) to the magnetic poles where the polar dip angle D is at a maximum (D=90°); the horizontal component H varies from a maximum value to a minimum value of zero, while the normal component Z varies from a minimum value of zero to a maximum value. Between the magnetic equator and the magnetic poles, the Earth's magnetic field vector B is composed of the horizontal component H and the normal component Z. The variation of the horizontal component H as a function of the dip angle D between the magnetic equator and the magnetic poles is $$\vec{B}(\cos D°) = \vec{H}. \qquad 3$$

The variation of the normal component Z as a function of the dip angle D between the magnetic equator and the magnetic poles is $$\vec{B}(\sin D°) = \vec{Z} \qquad 4$$

Thus the magnitude of the contribution by the horizontal component H and by the normal component Z is determined by the dip angle D.

For the first stage, magnetic iron filings 1 are attached onto the silicon platform 2. Prior to the attachment of the magnetic iron filings 1, the magnetic domains of the magnetic iron filings 1 which determine the magnetic polarity of the filings 1 are oriented parallel with respect to one another. The parallel orientation of the magnetic domains creates a magnetic dipole in the magnetic filings 1. The magnetic dipole in the magnetic filings 1 are aligned such that one end of the magnetic filings 1 is the north pole of the dipole and the opposite end of the magnetic filings 1 is the south pole of the dipole. The dipole created by the magnetic iron filings 1 can be utilized as a directional magnetic sensor which is responsive to the Earth's magnetic field vector B. Since opposite magnetic poles (north-south) attract, when the Earth's magnetic force vector $F_B$ is opposite in magnetic polarity to the magnetic iron filings 1 of the magnetic sensor, the Earth's magnetic force vector $F_B$ is an attractive magnetic force vector $F_{attractive}$ shown in FIG. 4. Conversely, since similar magnetic poles (north-north or south-south) repel, when the Earth's magnetic field vector B is similar in magnetic polarity to the magnetic iron filings 1 of the magnetic sensor, the Earth's magnetic force vector $F_B$ is a repulsive magnetic force vector $F_{repulsive}$ shown in FIG. 5. When the Earth's magnetic force vector $F_B$ is an attractive magnetic force vector $F_{attractive}$ and is directed normal to the magnetic material 1, the magnitude of the attractive magnetic force vector $F_{attractive}$ is at a maximum while the repulsive magnetic force vector $F_{repulsive}$ is zero. As the magnetic sensor is rotated 180°, the magnitude of the attractive magnetic force vector $F_{attractive}$ decreases approaching zero while the repulsive magnetic force vector $F_{repulsive}$ increases proportionally approaching a maximum. Further rotation of the magnetic sensor from 180° to 360°, results in the attractive magnetic force vector $F_{attractive}$ to increase to a maximum, while the repulsive magnetic force vector $F_{repulsive}$ decreases proportionally approaching zero. When a magnetic force vector $F_B$ is directed onto the device platform 2, the silicon platform 2 is displaced by a distance $\Delta X_C$ which is a function of the surrounding spring-like silicon membrane 3. The device response is similar to that of a spring in which a force is applied and the corresponding change in the spring length is measured. The force exerted by the spring-like silicon membrane 3 $F_s$ is equal in magnitude but opposite in direction to the force exerted by the Earth's magnetic force vector $F_B$ on the silicon platform 2. The spring force $F_s$ is $$\vec{F_s} = -k\Delta\vec{X_C} \quad [N] \qquad 5$$

where
  k=spring constant
  $\Delta\vec{X_C}$=extension of the spring along the x axis.

Equation 5 is an expression of Hooke's law for springs. The direction of the spring force $F_s$ is always opposite to the direction of the spring displacement $\Delta X_C$ from the origin (x=0). Thus when the spring is stretched ($\Delta x>0$), $F_s$ is negative and when the spring is compressed ($\Delta x>0$), $F_s$ is positive. Thus, the spring force is a restoring force vector directed toward the origin (x=0) of the spring.

The magnetic sensor can be modeled as the mechanical network shown in FIG. 6. The displacement of the silicon platform 2 by the magnetic force vector $F_B$ is determined by the stiffness of the silicon membrane 3. The silicon membrane 3 which supports the silicon platform 2 is represented as a spring in the mechanical network. The silicon platform 2 stiffness is defined with the spring constant k as $$k = \frac{F}{\Delta X_C} \left[\frac{N}{m}\right] \qquad 6$$

where
  $\Delta X_C$=change in the capacitor plate separation from the initial plate separation $\Delta Y_{CO}$ to the final plate separation $X_C$.

Figure 7A:
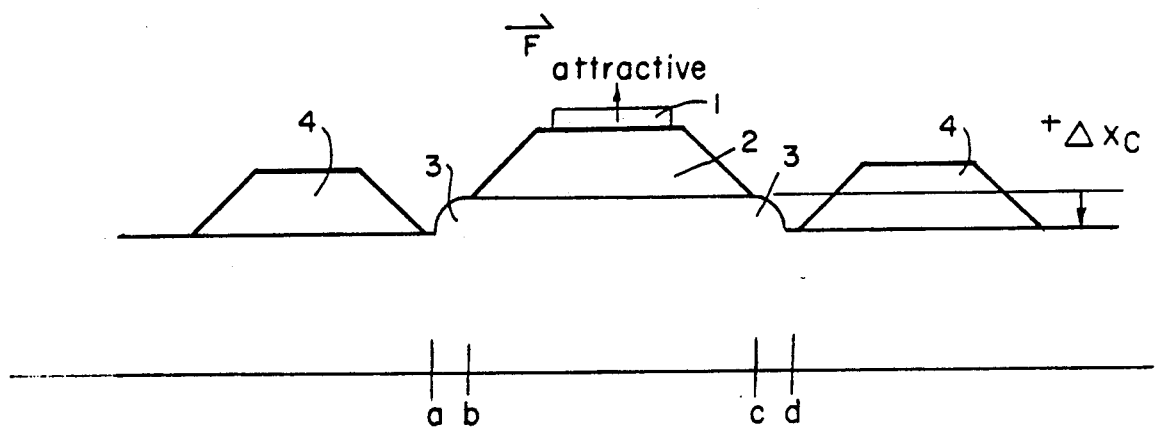
FIG. 7a illustrates an increase in capacitive plate spacing which results in a decrease in capacitance when the sensor is under the influence of an attractive force.
Figure 8A:
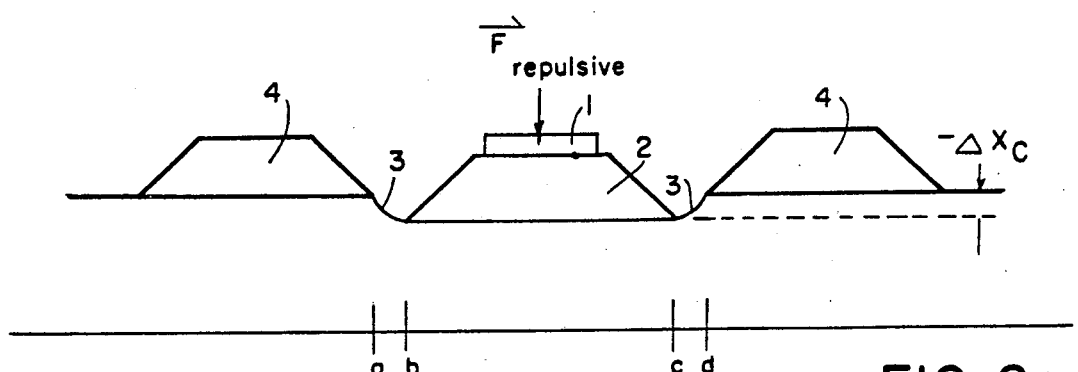
FIG. 8a illustrates a decrease in capacitive plate spacing in response to a repulsive magnetic field. This results in an increase in capacitance

The slope of the deflected plate is zero at the four boundaries a, b, c and d shown in FIG. 7a for an attractive magnetic force vector $F_{attractive}$ and in FIG. 8a for a repulsive magnetic force vector $F_{repulsive}$. A maximum displacement of the silicon platform 2 and the silicon membrane 3 of a distance $\pm\Delta X_C$ occurs at the silicon platform 2 boundaries b and c. The boundary conditions are then $$X(a)=X(d)=0 \qquad 7$$

$$X(b)=X(c)=X_C. \qquad 8$$

Figure 7B:
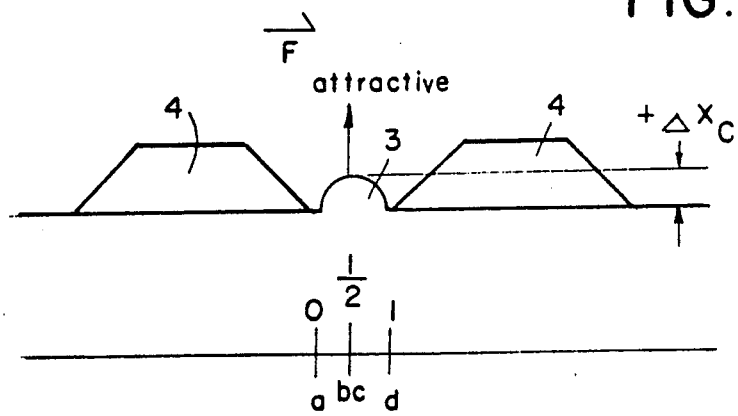
FIG. 7b illustrates the simplified mathematical model possible with the device performing as a fixed edge center loaded beam.
Figure 8B:
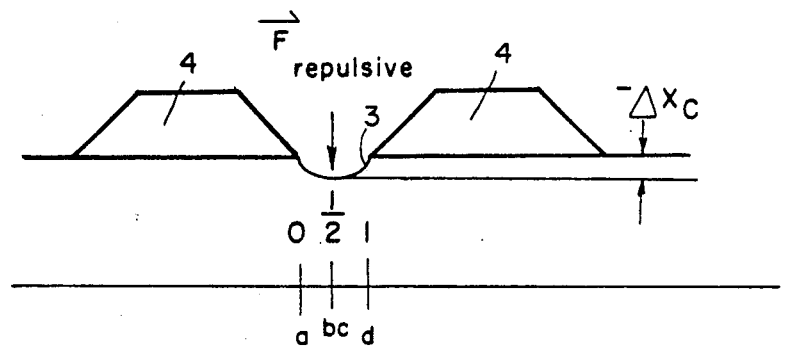
FIG. 8b illustrates the simplified mathematical model for the device again performing as a fixed edge center loaded beam in response to a repulsive magnetic force.

The magnetic force vector $F_B$ deflects the silicon platform 2 uniformly and the silicon platform 2 thickness is much greater than the membrane 3 thickness. Thus the silicon platform 2 can be removed without affecting the silicon membrane 3 plate stiffness. The resultant structure is shown in FIG. 7b for an attractive magnetic force vector $F_{attractive}$ and in FIG. 8b for a repulsive magnetic force vector $F_{repulsive}$. The structure of FIG. 7b and FIG. 8b is modeled as a fixed edge center loaded beam of length l. The deflection profile of an edge center loaded beam of length l with a deflection of $\pm\Delta X_C$ is $$\pm\Delta X_C(x) = \frac{Fx^2}{48EI}[4x - 3l] \quad [m] \qquad 9$$

where
  F=applied force [N]
  E=modulus of elasticity for silicon [N/m$^2$]
  I=moment of inertia of the beam through the neutral axis [m$^4$].

Using Eq. 6, the spring constant for a beam of length l at the point of the applied force (x=l/2) is $$k\left(x = \frac{l}{2}\right) = \frac{F}{\Delta X_C(x)} \qquad 10$$

$$= \frac{F}{\frac{Fx^2}{48EI}(4x - 3l)} \qquad 11$$

$$= \frac{48EI}{\frac{l^2}{4}(2l - 3l)} \qquad 12$$

$$k\left(x = \frac{l}{2}\right) = \frac{192EI}{l^3}. \qquad 13$$

Solving for the moment of inertia I of an elemental length of beam which represents the silicon membrane 3 in Eq. 9 is $$I = \int_{-h/2}^{h/2} y^2 dy dz \quad (14)$$

$$= \frac{1}{3} h^3 \Big|_{-h/2}^{h/2} dz \quad (15)$$

$$= \left[\frac{1}{3}\left(\frac{h}{2}\right)^3 - \frac{1}{3}\left(-\frac{h}{2}\right)^3\right] dz \quad (16)$$

$$= \frac{2h^3}{24} dz \quad (17)$$

$$= \frac{h^3}{12} dz \ [m^4] \quad (18)$$

where
h = silicon membrane 3 thickness [m].

Substituting Eq. 18 into Eq. 13 for a length of the membrane 3 of length l along the z axis, the spring constant for a fixed edge silicon membrane 3 simplifies to $$dk = \frac{16E}{l(z)^3} h^3 dz \quad (19)$$

$$k = 16Eh^3 \int_0^z \frac{1}{l(z)^3} dz. \quad (20)$$

With the membrane 3 dimensions of 2.5 mm along the z axis (length of one side) and 0.5 mm along the x axis (width), the specific solution using Eq. 20 for the device is $$k = 1.026E - 5 \ Nm \int_0^{.0025 \ m} \frac{1}{(.0005 \ m)^3} dz \quad (21)$$

$$k = 205.2 \frac{N}{m}. \quad (22)$$

The 1 by 1 square silicon platform 2 is supported on all four sides by the silicon membrane 3, which is modeled as a beam. Thus Eq. 22 represents the silicon membrane 3 on one side of the silicon platform 2 which is 25% of the total membrane 3 area which contributes to the spring constant. Therefore the total spring constant ($k_T$) of the device is $$k_T = 4k = 820.8 \frac{N}{m}. \quad (3.23)$$

For a static method of measuring the Earth's magnetic force, the magnitude of the displacement of the silicon platform 2 depends on the magnitude of the magnetic force $F_B$ directed onto the onto the silicon platform 2 and the spring constant of the silicon membrane 3. From Eq. 5 and Eq. 6 the magnitude of the displacement of the silicon platform 2 is $$F = -k(\pm \Delta \vec{X}_C) = \vec{F}_B \quad [N] \quad (24)$$

$$\pm \Delta \vec{X}_C = \frac{\vec{F}_B}{k}. \quad (25)$$

For the second stage, the change in the capacitor plate separation is transduced to an electrical capacitive change. When the magnetic force vector $F_B$ is a repulsive magnetic force $F_{repulsive}$ directed onto the silicon platform 2, the initial capacitor plate separation $X_{CO}$ decreases by a distance $-\Delta X_C$. When the magnetic force vector $F_B$ is an attractive magnetic force $F_{attractive}$ directed onto the silicon platform 2, the initial capacitor plate separation $X_{CO}$ increases by a distance $+\Delta X_C$. The change in the capacitor plate separation is $$X_C = X_{CO} \pm \Delta X_C(\vec{F}_B) \quad (26)$$

where
$X_{CO}$ = initial capacitor plate separation with zero magnetic force vector directed onto the silicon platform 2

$\pm \Delta X_C(\vec{F}_B)$ = change in the capacitor plate spacing due to the magnetic force vector directed onto the silicon platform 2.

Figure 4:
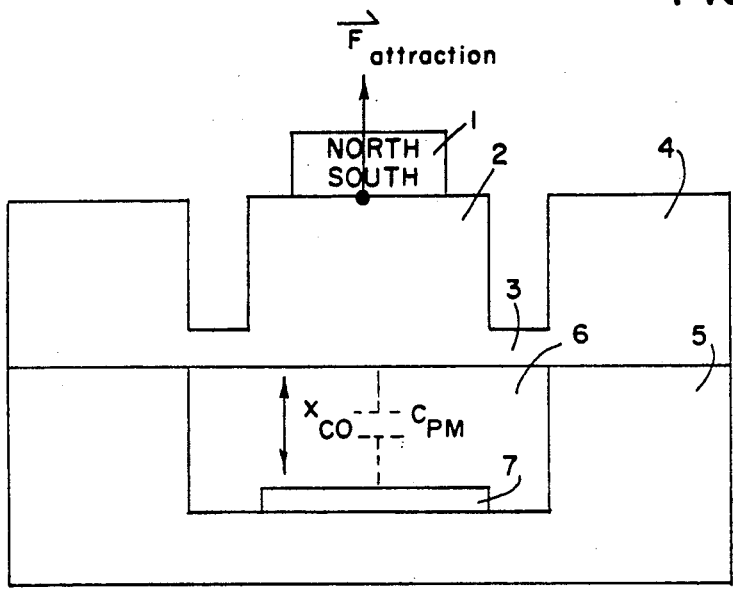
FIG. 4 is a schematic diagram of the magnetic material 1 on the silicon platform 2 with a force vector $F_{attraction}$ altering the capacitive plate separation by increasing the separation leading to an electrical capacitive change of the preferred embodiment. The silicon substrate consists of the platform 2, diaphragm membrane 3 and die 4. The glass substrate 7 consists of the aluminum pad 5 recessed into the etched well 6.
Figure 5:
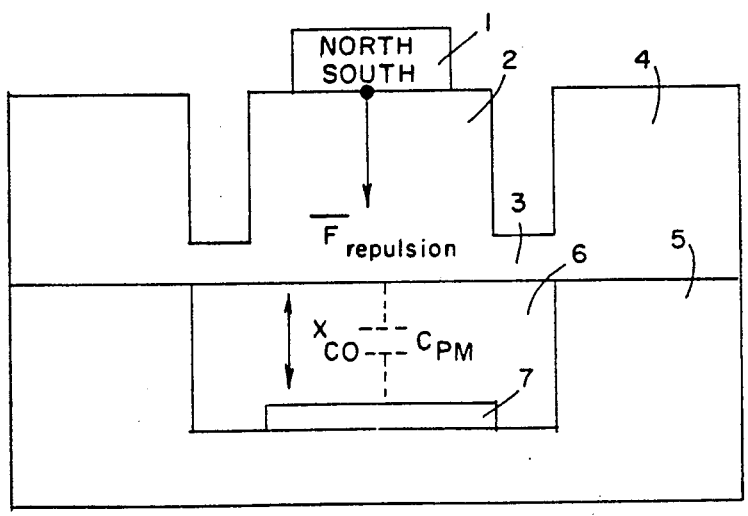
FIG. 5 is a schematic diagram of the magnetic material 1 on the silicon platform 2 with a force vector $F_{repulsion}$ altering the capacitive plate separation by decreasing the separation leading to an electrical capacitive change of the preferred embodiment. The silicon substrate consists of the platform 2, diaphragm membrane 3 and die 4. The glass substrate 7 consists of the aluminum pad 5 recessed into the etched well 6.

The magnetic force vector $F_B$ of an attractive magnetic force $F_{attractive}$ directed onto the silicon platform 2 was shown in FIG. 4. The increase from the initial capacitor plate separation $X_{CO}$ to the final capacitor plate separation $X_C$ is transduced to a capacitance change from the initial total capacitance $C_O$ to the final capacitance C. The magnetic force vector $F_B$ of a repulsive magnetic force $F_{repulsive}$ directed onto the silicon platform 2 is shown in FIG. 5. The theoretical initial total capacitance $C_O$ of the magnetic sensor with the magnetic filings 1 attached onto the silicon platform 2 with the Earth's magnetic force vector $F_B$ zero is $$C_0 = \frac{\epsilon_0 A}{X_{CO}} \quad (27)$$

where
$\epsilon_O$ = permittivity of air
A = area of the silicon platform 2 and the silicon membrane 3.

The original total capacitance $C_O$ is composed of three components which are $$C_O = C_{PM(FE)} + C_M + C_P \quad (28)$$

where
$C_{PM(FE)}$ = silicon platform 2 with attached magnetic iron filings 1 capacitance
$C_M$ = silicon membrane 3 capacitance
$C_P$ = total parasitic capacitance.

The silicon platform 2 capacitance $C_{PM}$ in Eq. 28 is $$C_{PM(FE)} = \frac{\epsilon_0 A_{PM}}{X_C} \quad (29)$$

where
$A_{PM}$ = area of the silicon platform 2.

Assuming that the silicon platform 2 is uniformly displaced along the x-axis, the platform 2 capacitance $C_{PM(FE)}$ as a function of the change in the capacitor plate separation $\Delta X_C$ is $$C_{PM(FE)} = C_0 \left[1 \pm \frac{\Delta X_C}{X_{CO}}\right] + C_P. \quad (30)$$

Furthermore, Hooke's law requires for a deflection of the silicon membrane 3, the silicon platform 2 displacement $\pm \Delta X_C$ must be proportional to the magnetic force vector $\vec{F}_B$ acting on the mass on the silicon platform 2 as $$\vec{F}_B = -k\Delta \vec{X}_C \qquad 31$$

where
$k$ = Hooke's law spring constant dependent on the silicon membrane 3 thickness and width.

Solving for the silicon platform 2 displacement $\pm \Delta X_C$ as a function of the spring constant k, $$\pm \Delta \vec{X}_C = -\frac{\vec{F}_B}{k}. \qquad 32$$

Substituting Eq. 32 into Eq. 30, the silicon platform 2 capacitance $C_{PM(FE)}$ as a function of the spring constant k is $$C_{PM(FE)} = \pm \frac{\vec{F}_B}{k X_{CO}} + C_O + C_P \qquad 33$$

$$C_{PM(FE)} = C_2 \pm \frac{\vec{F}_B}{k X_{CO}} \qquad 34$$

where $C_2 = C_O + C_P$

Thus, the change in $C_{PM(FE)}$ is linearly proportional to the magnitude of the magnetic force vector $F_B$ acting on the magnetic filings 1 mass. An attractive magnetic force vector $F_{attractive}$ decreases the silicon platform 2 capacitance $C_{PM(FE)}$ while a repulsive magnetic force vector $F_{repulsive}$ increases the silicon platform 2 capacitance $C_{PM(FE)}$. The capacitance $C_M$ due to the silicon membrane 3 in Eq. 28 is $$C_M = \frac{\epsilon_o A_M}{X_C} \qquad 35$$

where
$A_m$ = area of the silicon membrane 3.

There are two components which contribute to the total parasitic capacitance $C_P$ in Eq. 28. The first component is attributed to an incomplete bond between the silicon substrate and glass substrate which results in a parasitic capacitance $C_{P1}$ across the finite distance $d_{P1}$ between the two substrates. The parasitic capacitance $C_{P1}$ is $$C_{P1} = \frac{\epsilon_o A_{P1}}{d_{p1}} \qquad 36$$

where
$A_{p1}$ = area of aluminum strip along the periphery of the glass well 6
$d_{p1}$ = air gap between the silicon substrate and the glass substrate 7.

The presence of the air gap $d_{P1}$ contributes to the parasitic capacitance $C_{P1}$ as shown in Eq. 36. Anodic glass to silicon bonding is selected to bond the two substrates rather than adhesive bonding techniques since the potential for an incomplete bond which produce air gaps is greater for the adhesive bonding technique. Thus $C_{P1}$ can be essentially eliminated by utilizing anodic glass to silicon bonding.

A second area of potential parasitic capacitance $C_{P2}$ occurs in the extended etched channel of the glass substrate 7. The extended etched channel vents the air from within the capacitor cavity and allows the extension of the electrical contact from the aluminum pad 5 without shorting to the silicon substrate. The extended etched channel has a parasitic capacitance of $$C_{p2} = \frac{\epsilon_o A_{p2}}{d_{p2}} \qquad 37$$

where
$A_{p2}$ = area of aluminum strip in the channel below the silicon substrate
$d_{p2}$ = air gap between the aluminum strip and the silicon substrate.

Unlike $C_{p1}$, $C_{p2}$ is inherent to the device design and cannot be eliminated.

An experimental method to measure the parasitic capacitance of the device involves the removal of the silicon platform 2, the attached magnetic iron filings 1 and the surrounding silicon membrane 3. The resulting capacitance change from the initial capacitance of the intact device is the parasitic capacitance $C_P$ which is $$C_P = (C_{PM(FE)} + C_M) - (C_{w/o\ PM(FE)} + C_{w/o\ M}) \qquad 38$$

where
$C_{w/o\ PM(FE)}$ = device without the silicon platform 2 and the attached magnetic iron filings 1
$C_{w/o\ M}$ = device without the silicon membrane 3.

Therefore the contribution of the three capacitive components, including the silicon platform 2 capacitance $C_{PM}$, the silicon membrane 3 capacitance $C_M$ and the total parasitic capacitance $C_P$ to the initial capacitance $C_O$ with zero magnetic force vector $F_B$ on the device can be quantified using Eq. 28 as $$C_O = \epsilon_o \left[ \left( \frac{A_{PM} + A_M}{Y_{CO}} \right) + \frac{A_{p1}}{d_{p1}} + \frac{A_{p2}}{d_{p2}} \right] [F]. \qquad 39$$

For the static method of measuring the magnetic force, the Earth's magnetic force vector changes the initial capacitive plate separation $X_{CO}$ to the final capacitive plate separation $X_C$ by a distance $\pm \Delta X_C(F_B)$ as was shown in Eq. 26. The resulting change in the capacitance $\Delta C$ due to the change in the capacitor plate separation $\pm \Delta X_C(F_B)$ is $$\pm \Delta C = \frac{\epsilon_o A}{\Delta X_C} \qquad 40$$

With the Earth's magnetic force vector $F_B$ directed onto the silicon platform 2, the resulting capacitive change $\pm \Delta C$ to the initial capacitance $C_O$ has an inverse square relationship to the resulting change in the capacitor plate separation $\Delta X_C$. The change in the capacitance $\Delta C$ from Eq. 40 with respect to the change in the capacitive plate separation $\Delta X_C$ is $$\frac{\delta C}{\delta X_C} = \frac{\delta \epsilon_o}{\delta X_C} \left( \frac{A}{X_C} \right) + \frac{\delta A}{\delta X_C} \left( \frac{\epsilon_o}{X_C} \right) + \frac{\delta X_C^{-1}}{\delta X_C} (\epsilon_o A). \qquad 41$$

The permittivity of air and the silicon platform 2 area remains constant therefore the first and the second term in Eq. 41 goes to zero. Equation 3.41 then simplifies to $$\frac{\delta C}{\delta X_C} = -\frac{\delta X_C^{-1}}{\delta X_C}(\epsilon_O A) \quad (42)$$

$$= -\frac{\epsilon_O A}{X_C^2} \quad (43)$$

$$\delta C = -\frac{\epsilon_O A}{X_C^2} \delta X_C \quad (44)$$

$$\Delta C = -\frac{\epsilon_O A}{X_C^2} \Delta X_C \quad (45)$$

Thus the change in the capacitor plate separation $\Delta X_C$ has a linear effect to the change in the capacitance $\Delta C$. The final capacitor plate separation $X_C$ has an inverse square relationship on the change in the capacitance $\Delta C$ shown in Eq. 45. The change from the initial capacitance $C_O$ to the final capacitance C by $\Delta C$ as a function of the magnetic force vector $F_B$ directed onto the magnetic filings 1 on the silicon platform 2 is the final capacitance $C(F_B)$. The final capacitance $C(F_B)$ as a function of the Earth's magnetic force vector $F_B$ directed on the magnetic filings 1 which is attached onto the silicon platform 2 is $$\pm C(\vec{F}_B) = C_O \pm \Delta C \quad (46)$$

Substituting Eq. 27 and Eq. 40 into Eq. 46, the final capacitance $\pm C(F_B)$ as a function of the change in the capacitor plate separation $\pm \Delta X_C$ is $$\pm C(\vec{F}_B) = \frac{\epsilon_O A}{X_{CO}} \pm \frac{\epsilon_O A}{\Delta X_C} \quad (47)$$

which can be rewritten as $$\pm C(\vec{F}_B) = \epsilon_O A \left[\left(\frac{1}{X_{CO} \pm \Delta X_C}\right)\right][F]. \quad (48)$$

Substituting Eq. 25 into Eq. 48, the final capacitance $\pm C(\vec{F}_B)$ due to the Earth's magnetic force vector $F_B$ is $$\pm \Delta X_C = \frac{M\vec{g}}{k} \quad (25)$$

$$\pm C(\vec{F}_B) = \epsilon_O A \left[\left(\frac{1}{X_{CO} \pm \frac{M\vec{g}}{k}}\right)\right] \quad (49)$$

The resulting capacitive change $\pm \Delta C(F_B)$ from the initial capacitance $C_O$ to the final capacitance $\pm C(F_B)$ due to the Earth's magnetic force vector $F_B$ directed on magnetic filings 1 which is attached onto the silicon platform 2 from Eq. 46 is $$\pm \Delta C(\vec{F}_B) = \pm C(\vec{F}_B) - C_O. \quad (50)$$

Substituting Eq. 27 and Eq. 46 into Eq. 50 the final capacitive change $\pm \Delta C(F_B)$ as a function of the Earth's magnetic force vector $F_B$ is $$\pm \Delta C(\vec{F}_B) = \epsilon_O A \left[\left(\frac{1}{X_{CO} \pm \frac{M\vec{g}}{k}}\right)\right] - \frac{\epsilon_O A}{X_{CO}} \quad (51)$$

$$\pm \Delta C(\vec{F}_B) = \epsilon_O A \left(\frac{1}{X_{CO} \pm \frac{M\vec{g}}{k}} - \frac{1}{X_{CO}}\right)[F]. \quad (52)$$

From Eq. 49 and Eq. 52, the final capacitance $\pm C(F_B)$ and the magnitude of the change in the capacitance $\pm \Delta C(F_B)$ are functions of the direction and the magnitude of the Earth's magnetic force vector $F_B$.

Figure 9:
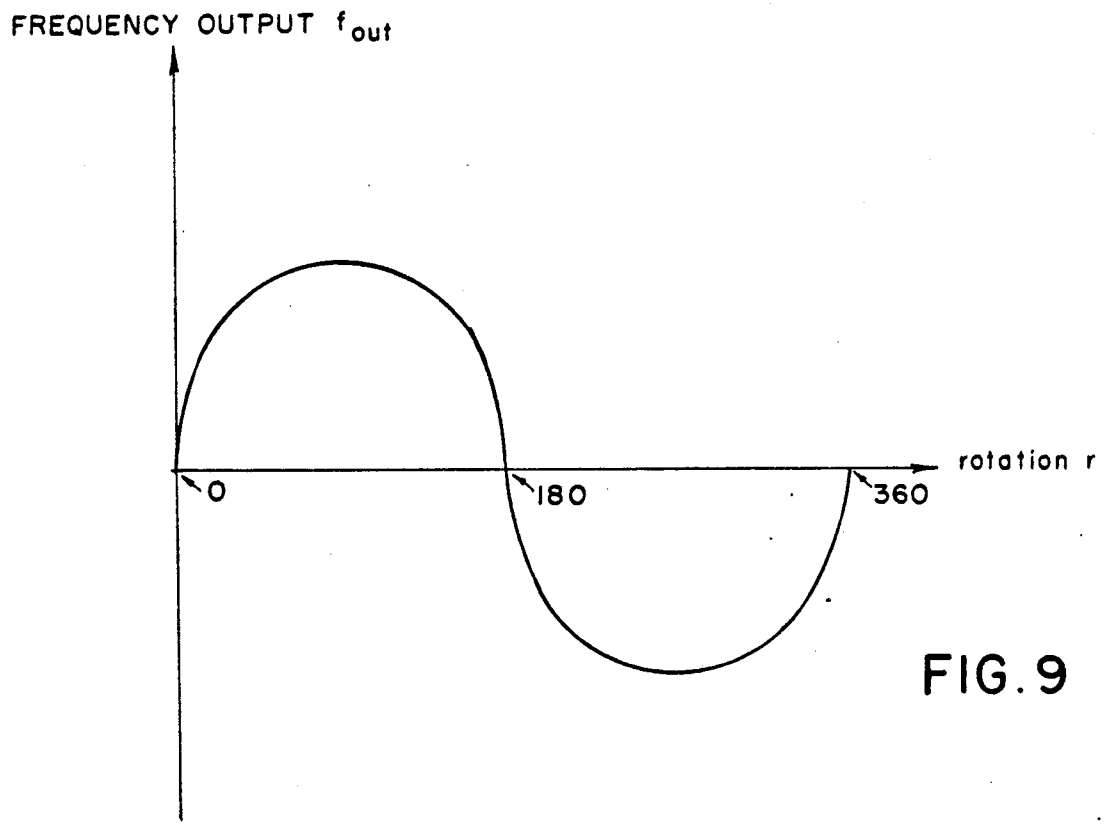
FIG. 9 illustrates the calculated theoretical sinusoid relationship between the magnitude of the rotation of the magnetic sensor and the resulting proportional sinusoid frequency output $f_{out}$ from the magnetic sensor.

As the device is rotated, the Earth's magnetic force vector $F_B$ which is directed onto the magnetic filings 1 is proportionally displaced by the magnitude of the rotation. The magnitude of the displacement of the Earth's magnetic force vector $F_B$ from the magnetic filings 1 on the device is represented by the dip angle D. The 360° rotation of the device in increments of 45° results in the dip angle D to proportionally range from a minimum of 0° to a maximum of 360°. The variation of the dip angle D results in a sinusoid variation of the components of the Earth's magnetic field vector B as shown in Eq. 3 and Eq. 4. The sinusoid variation in the horizontal component H and the sinusoid variation in the normal component Z results in a sinusoid variation of the Earth's magnetic force vector $F_B$. A sinusoid variation in the Earth's magnetic force vector $F_B$ proportionally displaces the silicon platform 2 sinusoidally by a distance $\pm \Delta X_C(F_B)$ as was shown in Eq. 25. A sinusoid displacement of silicon platform 2 by a distance $\pm \Delta X_C(F_B)$ is transduced in a linear and proportional manner to a sinusoid change in the capacitance $\pm \Delta C(F_B)$ as was shown in Eq. 52. Thus a rotation of the magnetic sensor results in a sinusoid change in the Earth's magnetic force vector $F_B$ which is transduced in a linear and proportional manner by the magnetic sensor to a sinusoid change in the capacitance $\pm \Delta C(F_B)$ as shown in FIG. 9.

When an acceleration or gravitational force is present, the magnetic sensor responds to both the non-magnetic force and the magnetic force. FIG. 11 shows comparison sensors for elimination of gravitational or acceleration force effects.

To determine the magnetic force normal to the platform surface, it is necessary to measure the value of both the magnetic force and the gravitational force together, and to independently measure the magnitude of the acceleration or gravitational force, and to subtract this latter force from the total force to achieve a value for the magnetic force and thus a value for the normal component of the magnetic field. This is easily accomplished by using two sensors side by side where only one of the sensors has a magnetic coating 1. The first sensor 21 (FIG. 11) measures only acceleration or gravitational force, the second sensor 11 (FIG. 11) measures both accelerative and magnetic forces. The subtraction of the force measured by sensor 21 from the total component force measured by sensor 11 results in the force due only to the magnetic field. From this latter force component the magnetic field can be deduced.

The measurement of acceleration such as gravitational acceleration is accomplished by using sensor 21 (acceleration). The magnitude of the force normal to the platform 2 is subtracted from the total force measured by sensor 11 (magnetic and acceleration) to provide the normal component force solely due to the magnetic field component interacting with the magnetic material on sensor 11. The essential difference between the two sensors 11 and 21 is that sensor 11 has the addition of magnetic material 1 on the platform 2 whereas sensor 21 does not have magnetic material on platform 2.

To measure all three directions of magnetic field a hybrid combination of three magnetic sensors arranged to measure all three orthogonal components of magnetic force is easily constructed.

The magnetic material 1 may be attached to the pedestal 2 using electroplating, thermal vacuum deposition, sputtering, e-beam evaporation or another material deposition means. The area of coverage of the magnetic material may be controled to define the magnetic material pad 1 using conventional photolithographic methods similar to those used in integrated circuit technology. Alternatively, mechanical masking means may be used during magnetic material deposition to define magnetic material pad 1.

The measurement instrumentation arrangement is shown in FIG. 10. Here the capacitive sensor 11 is connected to a capacitance measurement device 12 such as a capacitance bridge or an oscillator, the frequency of said oscillator being dependent upon the sensor capacitance. An example of such an oscillator would be a relaxation oscillator. The output of the capacitance measuring instrument 12 is converted to a value of the force by using capacitance-to-force conversion instrumentation 14 and the value of the force determined from the capacitance measurement is displayed on a display instrument 16.

Two instrument configurations 31 such as described in FIG. 10 may be used on the two independent sensors 11 and 21 of FIG. 11 to measure the magnetic field. Alternatively, all or any portion, or combination of portions of the instrumentation 12, 14, 16 of FIG. 10 may be used to measure the forces on sensors 11 and 21.

It is noted that the pedestal 2 can be fabricated from magnetic material.

The magnitude of the normal component of the magnetic field can also be measured by measuring a dc voltage applied to the capacitor and necessary to achieve a predetermined reference value of the capacitance $C_{ref}$.

The correlation between the value of the dc voltage and the force arising from the normal component of the magnetic field allows the determination of the normal component of the magnetic field by an accurate measurement of the dc voltage necessary to achieve $C_{ref}$, or a related frequency $f_{ref}$.

An example of parameters for the micromechanical magnetic sensor is a silicon wafer thickness of 0.4 mm (equal to the platform 2 thickness, a membrane width of 0.5 mm and a membrane thickness of 1.1 micron, a platform 2 area of 2.5 mm×2.5 mm square, a glass well depth of 3.0 microns, an aluminum conducting capacitor plate 9 of 0.1 micron thickness and approximately 2.5 mm×2.5 mm area using magnitized iron filings as the magnetic material 1. The corresponding capacitance of 8.0 pf results in approximately 1.9 KHz frequency for a relaxation oscillator with a frequency variation from about 2.7 KHz to approximately 3.2 KHz over a magnetic field range of approximately +0.5 gauss to −0.5 gauss in this example.

In certain cases there may be an advantage in damping the motion of the platform 2 which responds to a force and which moves to cause a capacitance change. Damping, including critical damping, underdamping and overdamping are easily incorporated in the device by creating a port 8 in the supporting substrate between the region between the two capacitor plates and between the surroundings. The flow of a fluid such as air through the port is affected by the port length, shape and cross section. The resistance of the fluid flow caused by the port can be used to damp the motion of the moving platform. The rate of damping the platform motion can be affected by suitable choice of port length and size.

Electrical interconnects to the conduction plate can be passed through the same port, a similar port or passed through the region between the substrate means and the support means.

An example of a device structure and the related fabrication follows. For example, the Silicon Membrane Magnetic Sensor consists of an anisotropically etched central silicon platform 2 surrounded and supported by a spring-like thin silicon membrane 3 shown in FIG. 1. The silicon membrane 3 is supported by a silicon die 4 which is anodically bonded to a glass substrate 7 using standard glass to silicon bonding technology. Device fabrication consists of three major processing steps; silicon substrate processing, glass substrate processing and glass to silicon bonding.

The central platform 2, the membrane 3 and the die 4 structures can be fabricated on a single, p-type, (100) orientation silicon wafer doped with boron at $>10^{18} cm^{-3}$. The silicon platform 2, the supporting membrane 3, and the die 4 patterns were defined by growing a 7200 Å thick silicon dioxide blocking mask at 1100° C. for 60 minutes. The oxide mask blocks the subsequent diffusion of boron into the non-polished (back) surface of the silicon wafer is eventually anisotropically etched. The polished (front) and exposed back surface of the wafer are simultaneously doped with boron nitride solid source wafers at 1100° C. for 60 minutes. After the boron predeposition, the borosilicate glass and the blocking oxide mask are stripped off using 10:1 deionized water: hydrofloric acid (HF). The wafers are then immediately submerged in an anisotropic etching solution of ethylene diamine pyrocatachol (EDP) at 115° C. [6]. The undoped membrane 3 pattern on the back surface of the wafer is anisotropically etched to the heavily doped p+ ($>7 \times 10^{19}$ cm) etch stop layer which is diffused into the front surface creating, a 1.6 μm thick supporting membrane 3 structure. The complete silicon substrate structure is a 2.5 mm×2.5 mm square central platform, supported by a 0.5 mm wide membrane, surrounded by a 2.5 mm wide die support structure, in this example.

The glass substrate material uses 7740 Corning glass (Pyrex). The Pyrex glas has a reported thermal expansion coefficient which nearly matches the thermal expansion coefficient of the silicon substrate. A comparable thermal expansion coefficient is important for minimizing the stresses between the silicon substrate and the glass substrate during the high temperature glass to silicon bonding process.

Figure 12:
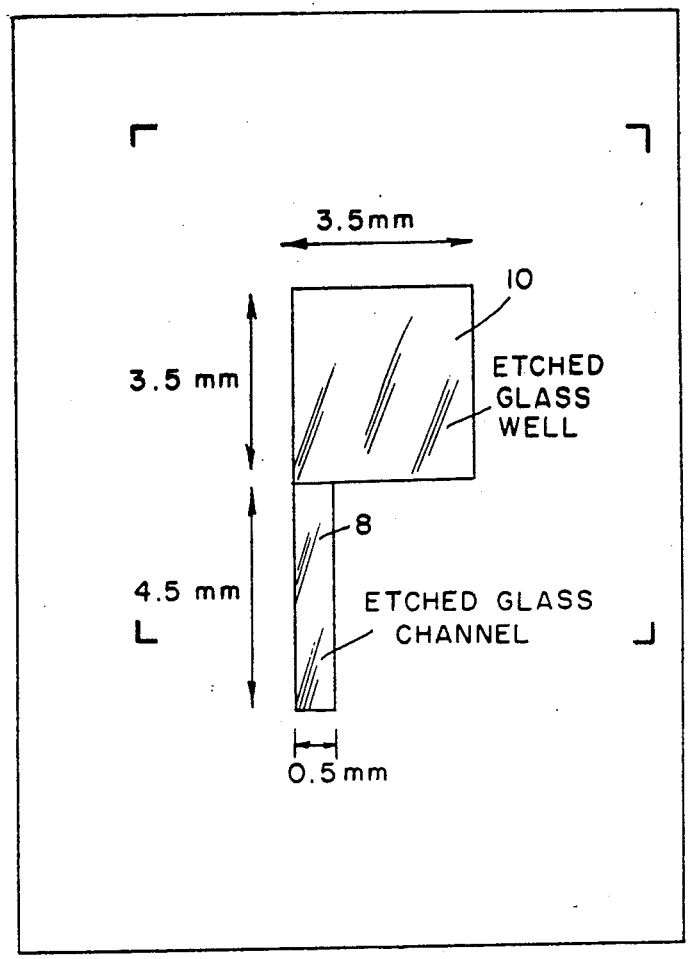
FIG. 12 shows the glass substrate and well.

As shown in FIG. 12 an etched channel 8 extending from the glass well 6 vents the air within the capacitor cavity and allows for an electrical contact to the aluminum pad 9 without shorting the aluminum pad to the silicon substrate. Electrical contact to the aluminum pad is shown in FIG. 1. An aluminum conductor strip 12 extends from widened contact 14 and disappears into channel 8 to join pad 9. Aluminum strip 16 extends from contact 18 to beneath the silicon die 4 where direct electrical contact occurs.

Figure 13:
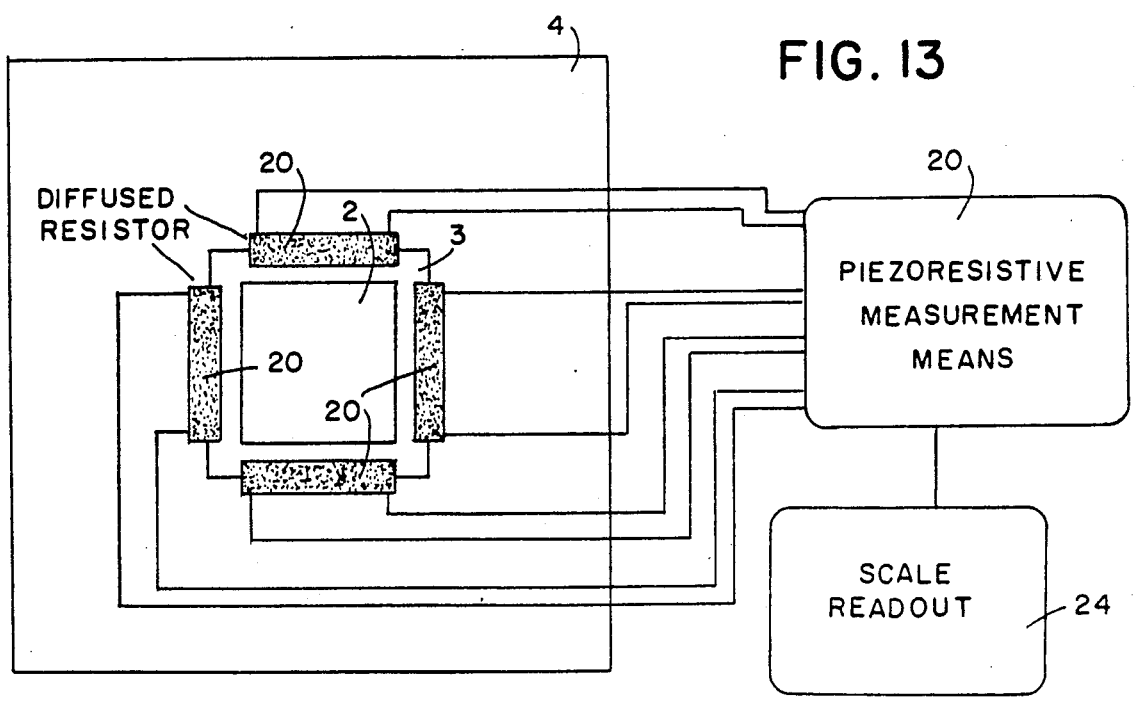
FIG. 13 shows a piezoresistive sensing means.

The membrane is displaced as a function of electric field or magnetic field force. The displacement may be measured using reflected light and polarizing grids. Preferably the displacement is measured by measuring a change in capacitance between a conductor in or on the membrane and a fixed conductor in the well. Alternatively voltage is applied between the two conductors to return the membrane to a null position, a known, measured capacitive position. The field force on the membrane may be determined by measuring the voltage required to return the membrane to the null position. Alternatively or conjointly for redundancy, as shown in FIG. 13, the membrane 3 displacement can be measured using one or more piezoresistive diffused resistors 20 on the membrane which change resistance with an application of a strain to the device. The strain in the membrane 3 due to the field force 1 can be characterized by the measured piezoreistivity, summed or averaged in measurement means 22 and converted to a readout on scale indicator 24. A 3 $\mu$m deep well 6 is etched into the glass substrate using buffered HF which consists of 500 gm:735 ml:110 ml, $NH_4F:DI:HF$. Centered within the etched well 6, an evaporated aluminum pad 5 functions as the static electrode portion of the capacitor. An aluminum strip is evaporated along the periphery of the etched well 6 providing an ohmic contact to the silicon die 4.

An etched channel extending from the glass well vented the air within the capacitor cavity 6 and allowed for an electrical contact to the aluminum pad 9 without shorting the aluminum pad to the silicon substrate.

The membrane 3 displacement can be measured using one or more piezoresistive diffused resistor which changes resistance with an application of a strain to the device. The strain in the membrane 3 due to the sensed magnetic field can be characterized by the measured piezoresistivity.

While the invention has been described with reference to specific embodiments, modifications and variations of the invention may be made without departing from the scope of the invention which is defined in the following claims.

We claim:

1. A method of measurement of electric and magnetic force comprising: etching a well and a channel within a supporting substrate, mounting a fixed capacitive plate within said well, attaching a dynamic substrate having a membrane portion serving as a displaceable capacitive plate to the supporting substrate, thereby suspending the displaceable capacitive plate portion of the dynamic substrate over the etched well and fixed plate, mounting a field responsive material on the displaceable capacitive plate, such that the membrane is in between the fixed plate and the material, displacing the capacitive plate by a field responsive force vector, transducing the plate thereby displacing the plate and producing an electrical capacitive change and sensing the change.

2. The method of claim 1 wherein the sensing comprises sensing magnetic force through the transduced electrical capacitive change.

3. The method of claim 1 wherein the transducing comprises changing capacitance by moving the displaceable plate in relation to a fixed plate.

4. The method of claim 1 further comprising mounting a similar but non-responsive material on a second similar displaceable capacitive plate, transducing the second plate, and displacing the second plate and producing electrical capacitance change and sensing the change, comparing the first capacitance change with the reference capacitance change.

5. The method of claim 1 further comprising mounting second and third similar responsive material on second and third displaceable capacitive plates arranging the first, second and third plates on XYZ orthogonal axis, separately transducing the plates and separately displacing the plates and producing separate electrical capacitive changes and separately sensing the changes thereby determining three components of the field.

6. The method of claim 5 wherein the mounting comprises mounting a magnetic responsive material.

7. The method of claim 1 wherein the mounting comprises mounting a magnetic responsive material.

8. The method of claim 7 further comprising indicating earth magnetic direction with the sensed change.

9. Magnetic and electric force vector sensing apparatus comprising a field reactive sensor having a supporting substrate with a well, means for mounting a fixed capacitance plate on the bottom of the well in the substrate, a dynamic substrate having a mounting means for mounting the dynamic substrate on the supporting substrate, a diaphragm membrane attached to the mounting means, a movable capacitive plate means on the diaphragm membrane, a platform attached to the diaphragm membrane, a magnetic material attached to the platform, such that the membrane is in between the fixed plate and the material, channeling port means for channeling air flow to and from the well, sensing means for sensing movement of the platform in response to a magnetic force vector acting on the magnetic material.

10. The apparatus of claim 9 wherein the diaphragm membrane and the platform are machined out of a monolithic element.

11. The apparatus of claim 10 wherein the monolithic element is silicon.

12. The apparatus of claim 10 wherein the mounting means is machined out of the same monolithic element.

13. The transducer apparatus of claim 9 wherein the magnetic sensor is produced through batch processing technology and micromachining methods.

14. The transducer apparatus of claim 9 wherein the dynamic substrate is etched from a single material.

15. The transducer apparatus of claim 14 wherein the single material is a semiconductor of crystalline structure.

16. The magnetic and electric force vector apparatus of claim 9 wherein the dynamic substrate is a silicon block.

17. The magnetic and electric force vector sensor apparatus of claim 9 wherein the means for fixing a capacitance plate comprises a well in the supporting substrate and further comprising a port means in the supporting substrate for flowing fluid into and out of the well.

18. The magnetic sensor apparatus of claim 17 wherein the port means comprises means for flowing gas.

19. The magnetic sensor apparatus of claim 17 wherein the port means comprises a damping means having a length and cross section for providing a specific amount of damping of motion of the movable plate displacement.

20. The magnetic sensor apparatus of claim 19 wherein the damping means comprises a critical damping means for providing critical damping.

21. The apparatus of claim 17 wherein a depth of the well determines sensitivity and measurement range of the sensor apparatus.

22. The apparatus of claim 9 wherein the geometry and dimension of the membrane may be changed to affect the magnetic sensor's sensitivity and measurement range.

23. The apparatus of claim 9 wherein the supporting means for holding the second capacitive plate in a fixed position is formed of silicon.

24. Magnetic and electric force vector sensor apparatus comprising a block having a recess, a displaceable membrane positioned over the recess, means for holding the membrane on the block over the recess, means for channeling fluid to and from the recess, magnetic means on the membrane such that the membrane is in between the recess and the magnetic means, measuring means for measuring displacement of the membrane and indicating means for indicating force related to the mass as a function of the measuring.

25. The apparatus of claim 24 wherein the measuring means comprises strain gauge means attached to the membrane.

26. The apparatus of claim 24 wherein the measuring means comprises piezoresistive film resistors on the membrane.

27. The apparatus of claim 24 wherein the measuring means comprises piezoresistive elements diffused in the membrane.

28. The apparatus of claim 24 wherein the measuring means comprises a first conductive means on the membrane.

29. The apparatus of claim 28 wherein the measuring means further comprises a second conductive means in the recess and electrical means for measuring changes between the first and second conductive means.

30. The apparatus of claim 29 wherein the measuring means further comprises driving means connected to the first and second conductive means for returning the conductive means to a null position and wherein the electrical means comprises means measuring potential in the driving means.

31. The apparatus of claim 30 wherein the measuring means further comprises means for measuring resistive changes in the first conductive means.

* * * * *